US009128154B2

(12) United States Patent
Cesari

(10) Patent No.: US 9,128,154 B2
(45) Date of Patent: Sep. 8, 2015

(54) APPARATUS FOR AT-SPEED TESTING, IN INTER-DOMAIN MODE, OF A MULTI-CLOCK-DOMAIN DIGITAL INTEGRATED CIRCUIT ACCORDING TO BIST OR SCAN TECHNIQUES

(71) Applicant: STMICROELECTRONICS S.r.l., Agrate Brianza (IT)

(72) Inventor: Franco Cesari, Trezzano sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/496,196

(22) Filed: Sep. 25, 2014

(65) Prior Publication Data
US 2015/0052411 A1 Feb. 19, 2015

Related U.S. Application Data

(62) Division of application No. 13/340,560, filed on Dec. 29, 2011, now Pat. No. 8,862,955.

(30) Foreign Application Priority Data

Dec. 29, 2010 (IT) .............................. VA2010A0100

(51) Int. Cl.
*G01R 31/3177* (2006.01)
*G01R 31/3185* (2006.01)
*G01R 31/317* (2006.01)

(52) U.S. Cl.
CPC ...... *G01R 31/3177* (2013.01); *G01R 31/31725* (2013.01); *G01R 31/31727* (2013.01); *G01R 31/318552* (2013.01); *G01R 31/318594* (2013.01)

(58) Field of Classification Search
CPC ................................................ G01R 31/318552
USPC .................... 714/731, 726, 727, 724, 729, 30
See application file for complete search history.

(56) References Cited

U.S. PATENT DOCUMENTS 4,503,537 A 3/1985 McAnney
6,442,722 B1 * 8/2002 Nadeau-Dostie et al. .... 714/731
(Continued)

OTHER PUBLICATIONS

Search Report for Italian application No. VA20100100, Ministero dello Sviluppo Economico, Munich, May 19, 2011, 2 pages.
(Continued)

*Primary Examiner* — Fritz Alphonse
(74) *Attorney, Agent, or Firm* — Seed IP Law Group PLLC

(57) ABSTRACT

An embodiment is directed to extended test coverage of complex multi-clock-domain integrated circuits without forgoing a structured and repeatable standard approach, thus avoiding custom solutions and freeing the designer to implement his RTL code, respecting only generally few mandatory rules identified by the DFT engineer. Such an embodiment is achieved by introducing in the test circuit an embodiment of an additional functional logic circuit block, named "inter-domain on chip clock controller" (icOCC), interfaced with every suitably adapted clock-gating circuit (OCC), of the different clock domains. The icOCC actuates synchronization among the different OCCs that source the test clock signals coming from an external ATE or ATPG tool and from internal at-speed test clock generators to the respective circuitries of the distinct clock domains. Scan structures like the OCCs, scan chain, etc., may be instantiated at gate pre-scan level, with low impact onto the functional RTL code written by the designer.

18 Claims, 8 Drawing Sheets

(56) References Cited

U.S. PATENT DOCUMENTS

| | | | |
|---|---|---|---|
| 6,980,042 | B2 | 12/2005 | LaBerge |
| 7,526,704 | B2 | 4/2009 | LaBerge |
| 7,574,635 | B1 | 8/2009 | Alfke |
| 2003/0097614 | A1* | 5/2003 | Rajski et al. ............ 714/30 |
| 2004/0268181 | A1* | 12/2004 | Wang et al. ............ 714/30 |
| 2005/0055615 | A1 | 3/2005 | Agashe et al. |
| 2005/0166104 | A1 | 7/2005 | Rich et al. |

OTHER PUBLICATIONS

Cesari et al., "Full hierarchical flow for custom On Chip Clock controller and Scan Compression insertion for at-speed testing," SNUG Europe 2008 Conference, p. 16.

Cesari et al., "Automatic Insertion Flow of On Chip Controller for At-Speed Testing," SNUG Europe 2007 Conference, p. 13.

Furukawa et al., "A Novel and Practical Control Scheme for Inter-Clock At-Speed Testing," Proceedings of the IEEE International Test Conference, pp. 1-10, 2006.

Hetherington et al., "Logic BIST for Large Industrial Designs: Real Issues and Case Studies," ITG International Test Conference, IEEE, Sep. 1, 1999, vol. CONF 30, pp. 358-367.

Lin et al., "High-Frequency, At-Speed Scan Testing," Speed Test and Speed Binning for DSM Designs, IEEE Design & Test of Computers, Sep.-Oct. 2003, pp. 17-25.

McLaurin et al., "The Testability Features of the MCF5407 Containing the $4^{th}$ Generation Coldfire Microprocessor Core," ITC International Test Conference, 2000 IEEE, pp. 151-159.

Nakao et al., "At-Speed Built-in Test for Logic Circuits with Multiple Clocks," Proceedings of the $11^{th}$ Asian Test Symposium (ATS'02), IEEE 2002, pp. 18-20.

Tendolkar et al., "At-Speed Testing of Delay Faults for Motorola's MPC7400, a PowerPCTM Microprocessor," Proceedings of IEEE VLSI Test Symposium, pp. 3-8, 2000.

Wang et al., "At-Speed Logic BIST Architecture for Multi-Clock Designs," Proceedings of IEEE International Conference on Computer Design: VLSI in Computers and Processors, pp. 475-478, 2005.

Xiaoxin et al., "An at-speed Scan Test Scheme Using On-Chip PLL," *Journal of Computer-Aided Design & Computer Graphics* 19(3):366-370, Mar. 2007, with English Abstract.

Zakaria et al., "Case Studies on Transition Fault Test Generation for At-Speed Scan Testing," 2010 $25^{th}$ International Symposium on Defect and Fault Tolerance in VLSI Systems, pp. 180-187.

Intel® IXP42X Product Line of Network Processors and IXC1100 Control Plane Processor Datasheet, Intel, Inc., Jul. 2010, 128 pages.

* cited by examiner

APPARATUS FOR AT-SPEED TESTING, IN INTER-DOMAIN MODE, OF A MULTI-CLOCK-DOMAIN DIGITAL INTEGRATED CIRCUIT ACCORDING TO BIST OR SCAN TECHNIQUES

PRIORITY CLAIM

The present application is a Divisional of copending U.S. patent application Ser. No. 13/340560, filed Dec. 29, 2011; which application claims the benefit of Italian Patent Application No. VA2010A000100, filed Dec. 29, 2010; all of the foregoing applications are incorporated herein by reference in their entireties.

TECHNICAL FIELD

The present disclosure relates in general to built-in self-test (BIST) and SCAN techniques of digital integrated circuits (digital ICs) and in particular to techniques adapted to test "at-speed" multi-clock-domain digital ICs.

BACKGROUND

It is generally recognized that conventional test techniques, such as stuck-at-fault testing supplemented with $I_{DDQ}$ (Direct Drain Quiescent Current) testing, are ineffective in screening out timing-related defects in modern small-feature-size (e.g., 90 nm) ICs, running at frequencies that may reach the GHz range [1].

On another account, in order to enhance flexibility, IC designs with multiple clocks have become more and more popular. Most system-on-chip (SoC) designs have multiple function components and various peripheral interfaces. Components and interfaces, following different standards, often operate at different frequencies. For example, the Intel® IXP425 network processor, which is widely used in communication systems, has a processor running at 533 MHz, three network processor engines running at 133 MHz, and a variety of interfaces running at various frequencies [4]. This multi-clock trend creates a difficult challenge for at-speed testing.

Nevertheless, at-speed testing of transition faults and path-delay faults is becoming essential in many applications for testing high performance digital circuits.

Theoretically, the required at-speed test clock signals could be provided either by an external ATE (Automatic Test Equipment) or generated on chip by internal PLLs, digital dividers, or equivalent integrated high frequency generators. However, the cost of a suitable ATE tool or the cost of the IC package may become prohibitive, especially for circuits running in the GHz range.

Therefore, there is a quest for a clock control in the test structure that would make it possible to carry out at-speed testing using a relatively low-speed ATE.

The concept of such a clock control is to use on-chip clock sources, such as, for example, PLLs or digital dividers, to provide at-speed test pulses, while the ATE tool provides shift pulses and test control signals of slower speed. On-chip-test-clock generation is economical and is utilized in many industry designs [2-3].

Many methods have been proposed to address the aggravation of the technical problems created by the presence of an increasing number of distinct clock domains. Publications [5] and [6] disclose an at-speed testing architecture for multi-clock-domain ICs, based on built-in self-test (BIST) logic; [7] discloses a control scheme for inter-clock at-speed testing. These control schemes may efficiently test the timing-related faults between clocks, but need additional logic to support intra-clock at-speed testing, thus increasing the area overhead. Moreover, these known schemes may generate only one type of test-clock pair, which means that they may not be flexible enough to support efficient ATPG (Automatic Test Pattern Generation) software techniques.

U.S. Pat. No. 4,503,537, which is incorporated by reference, describes a basic infrastructure for built-in self-test of digital ICs. A linear feedback shift register (LFSR) generates random patterns. A multi-input shift register (MISR) is used to collect and compact test responses. Multiple parallel scan chains are coupled between the LFSR and MISR for inserting test vectors into the circuit under test and for capturing the results. A BIST controller coordinates the loading of scan chains with pseudorandom patterns from the generator. After the loading of a pseudorandom pattern is completed, a single capture clock is applied to capture the responses into the scan chains. Subsequently, the responses are shifted out and compressed into a signature. The well-known scan technique wherein scan chains are implemented in a digital circuit design by dividing the design into combinational and sequential logic is used.

The sequential logic is used to form scan cells that can be configured into scan chains during testing of the circuit. Test stimulus in the form of a test vector of data is brought in from a source such as a PRPG and clocked into the scan chain. In capture mode, data is propagated from input scan cells through functional paths of the combinational logic and captured in output scan cells (which may be the same as or different from the input scan cells). Capture mode exercises the logic's functional paths and hence tests for faults in these structures. After capture, the scan enable changes the cell operation back to scan mode and the captured data is shifted out into a response compactor such as a multiple input signature register (MISR). While the response is shifted out for one scan vector, input data is shifted in for the next scan vector. Shift in and shift out become parallel operations. After the last scan vector is shifted into the MISR, a signature is obtained in the MISR. This signature is compared with a fault-free signature to determine if the digital circuit is fault-free.

Basically, two operations are performed in both BIST and SCAN architectures, namely: scan and capture. The scan operation shifts test data into a scan chain. Once there, the test data is available in the scan chain for propagation through the circuit. The capture operation then captures the test data response after the data has propagated through the circuit, normally within one clock cycle of the digital circuit's clock. The scan operation then shifts the response out of the scan chain. The quality of at-speed testing is determined by two or more edges of the functional clock. The clock edge at which the last shift occurs is the update edge. The update edge applies the test vector to the combinational logic. The capture edge is the clock edge at which the memory elements capture the test vector response. If one or more to-be-tested sequential elements within the logic core are not initialized during the scan operation, then more edges of the functional clock may be needed to initialize and test all circuit elements. Typically, this happens when the sequential elements are not included in any scan chain (e.g., flip-flop or latch), or are memory elements instantiated within the logic core (e.g., RAM modules).

An alternative scheme uses the capture clock to provide both update and capture edges. The minimum time between an update edge and a following capture edge is the time allowed for the data to propagate through the combinational logic. This time window is termed the "at-speed path".

According to the method disclosed in the above-mentioned patent, all scan chains are assumed to operate at the same frequency. If the circuit has multiple frequencies, it has to operate at the slowest frequency to allow enough time for signals in those slow domains to propagate reliably to steady states before they are captured. The transitions are generated by the last shift in every loading sequence. All responses are captured simultaneously.

Reference [8] discloses a clock-chain-based clock-control scheme adapted to efficiently test delay faults in intra-clock domain in an industry design running at 1 GHz, and [9] discloses an improved clock-chain-based clock-control scheme for multi-clock at-speed testing adapted to generate various test clock sequences for both inter-clock domain and intra-clock domain at-speed testing having a reduced area requirement with an increasing number of clock domains.

Another viable SCAN technique and implementing architecture adapted to effectively cope with the technical problem of at-speed testing of multi-clock-domain ICs is disclosed in the paper "Automatic Insertion Flow of On Chip Controller for At-Speed Testing", by Franco Cesari and Salvatore Talluto, presented at the SNUG Europe 2007 Conference, and in the successive paper "Full Hierarchical Flow for Custom On-Chip Controller and Scan Compression Insertion for At-Speed Testing", by Franco Cesari, Salvatore Talluto, Alfredo Conte, and Paolo Giovacchini, presented at the SNUG Europe 2008 Conference, the whole contents of which are incorporated by reference.

The SCAN architecture described in these publications is based on the insertion of dedicated-clock sourcing circuits, named OCCs (acronym for on-chip clock), at least one, and more likely several, for each clock domain of the multi-clock-domain IC.

These OCCs are finite state machines, the function of which is that of sourcing the respective test clock signals to the digital circuits of the domain, both those generated by the external ATE being used for the test, typically when carrying out conventional stuck-at faults checks, that may be supplemented by $I_{DDQ}$ (direct drain quiescent current) tests, and those generated internally by suitable integrated clock generators, for example PLLs, digital dividers, and alike functional circuits for at-speed testing for time-related faults such as transition faults (TF) and path-delay faults.

Defectiveness of multi-clock-domain digital ICs is measured by a calculated DPPM value on the basis of process yield and test coverage of the integrated devices. The DPPM value reflects the number of failures activated by the test program, which corresponds to the sum of failures due to different overall defect types.

As already mentioned, a particularly elusive type of defect are the transition faults (TF), and according to present day "at-speed" multiple-clock-domains digital-IC-testing techniques, TFs are normally tested "intra-domain" using the IEEE 1450 Standard test language, whilst "inter-domain" at-speed testing of transition fails remains the responsibility of the designer of the ICs, who has to guarantee two main test conditions, namely;

a) internal at-speed clocks phase predictability and coherently with the external test signals (ATE clocks, scan enable, etc.);
b) respect of the test cycle described in the Standard protocol.

SUMMARY

There is the well recognized need to improve the transition-fault coverage for

SCAN-test design schemes employing internal at-speed clock signals, derived by internal PLLs or digital-dividers-clock-signal generators, to be applied to the circuitries of the respective clock domain, in order to reduce the defectiveness value DPPM (according to the known Brown-Williams law).

An embodiment achieves extended test coverage of complex multi-clock-domain integrated circuits without forgoing a structured and repeatable standard approach. In an embodiment, custom solutions may be avoided, thus giving freedom to the digital designer to implement his RTL code, respecting the generally few mandatory rules identified and communicated by the DFT engineer. Therefore, scan structures like the OCCs, scan chain, etc., are instantiated at gate pre-scan level, with low impact on the functional RTL code written by the designer.

In an embodiment, it has now been found a viable manner of modifying the known on-chip clock sourcing circuits (OCCs) of the different clock domains described in the above-identified references, herein incorporated, for at-speed testing of multiple-clock-domain digital ICs, adapting them to the introduction in the test circuit of a new additional functional logic circuit block, named "inter-domain on-chip-clock controller" (icOCC), interfaced with every (so adapted) OCC, which actuates synchronization among the different OCCs that source the test clock signals coming from the external ATE and from internal at-speed test-clock generators to the respective circuitries of the distinct clock domains.

An embodiment of the icOCC circuit effectively resolves a persistent phase uncertainty between externally generated, ATE-controlled, test-clock signals (relatively slow) and the internally generated at-speed test-clock signals that manage each step of the scan test, namely: the scan shift and the scan capture steps.

Basically, the icOCC circuit of an embodiment recognizes the at-speed clock signal phases, after which it enables the OCCs to stimulate the logic circuitries across the different clock domains of the IC. In practice, the icOCC circuit permits control of the clock-signal pulses of "launch" and "capture", of external and internal origin, in a deterministic manner. Moreover, the icOCC circuit initializes every OCC for executing the scan-shift step.

An embodiment of the icOCC circuit makes it possible to load and manage in the right way the test patterns generated by an ATPG tool and loaded by the external ATE to stimulate the IC, when the cross-domain pattern generation is activated. Practically, the new added logic does not require any modification of the test protocol file "spf" in order to generate the test patterns. For example, it may be possible to reuse the old "spf" file, and to add the relations between the internal clock signals and the different internal clock domains.

This means that an ATPG test flow continues to be managed automatically according to a full SCAN technique as that described in the above-cited references.

An embodiment of the test scheme is adaptable also for architectural choices other than full SCAN using an ATPB tool, namely for a BIST solution, based on internal LSFR and MISR structures.

DETAILED DESCRIPTION

Figure 1:
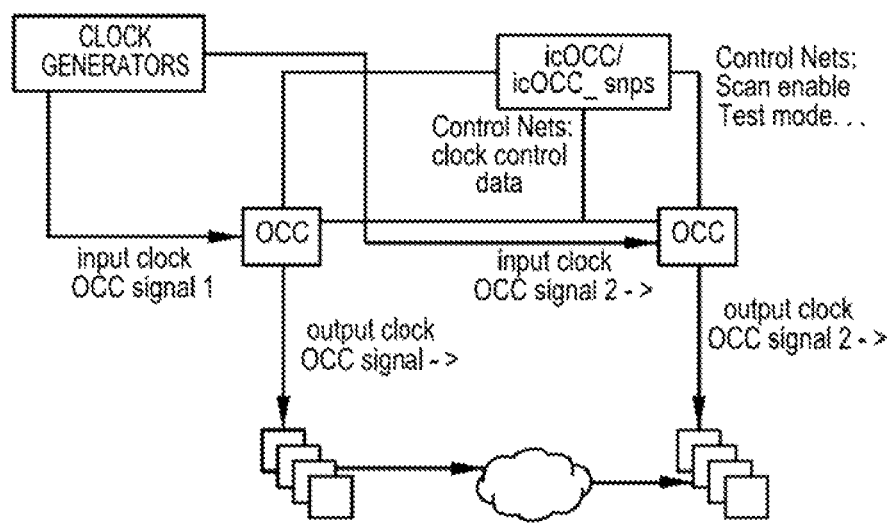
FIG. 1 depicts an embodiment of the basic scheme of interfacing between the icOCC circuit and the plurality of sourcing circuits OCCs for clock management in scan mode according to the cross-domain path.

FIG. 1 shows an embodiment of a basic scheme of clock sourcing management in SCAN mode for at-speed testing of multi-clock-domain digital ICs through a test structure using an ATPG tool and the symbolic representation of a cross domain path between two different clock domains. The external ATPG tool is adapted to manage the test patterns generation for both transition fault (TF) and path-delay-fault models, allowing wrong logic values to be captured by the scan registers and allowing detection of faults.

According to the previously cited disclosure at the SNUG-Europe 2007 and 2008 Conferences, insertion of clock sourcing logic OCCs for each clock domain is done at the RTL level of definition of the clock-tree distribution to the circuits of the respective clock domain of the digital IC design.

General rules of preparation of an appropriate RTL instruction flow as those described in the previously incorporated disclosures are recalled herein below:

1) all free-running clocks (PLL outputs), are identified as an insertion point for an OCC, and, in an embodiment, it is forbidden to insert two OCCs in sequence; that is, in an embodiment an OCC clock output of one OCC is never coupled to an OCC clock input of another OCC. The arrowed signals (e.g. ->) in FIG. 1 are the clock signals, used to load the value (1 or 0) into the scan flip-flop elements depicted as square blocks at the bottom of FIG. 1, launching and capturing the transition to stimulate the logic path within the "cloud". All free-running clock signals are provided by the PLLs or digital dividers within the IC (see, e.g., the Clock Generators in FIG. 1). These signals are considered as insertion points and input signals for each OCC blocks (e.g., arrowed Input clock OCC signal 1 and Input Clock OCC signal 2 in FIG. 1). Each OCC will gate its own clock, providing it to the scan flip-flops (e.g., arrowed signals Output clock OCC signal 1 and Output clock OCC signal 2 in FIG. 1). In an embodiment, it is forbidden to provide this gated output clock to another OCC. The other signals with no arrow and propagating between the OCCs and the icOCC are control signals (e.g., clk_ctrl_data_0, clk_ctrl_data_1 per the commented rtl code below).

2) any output signal of clock dividers propagates through multiplexing logic to the OCC input setting functional case analysis (all fastest frequency clocks are propagated). The OCCs are instantiated at the outputs of the multiplexing logic;

3) the DFT tool directly couples the ATE clock to the OCCs; therefore, there is no need to couple it at the RTL level;

4) an external ATE clock can pulse directly the scan flip-flop, but cannot do so for the OCCs;

5) the Test Mode (or Scan Mode) signal cannot be used to set the input multiplexing logic of OCCs; instead, the DFT tool adds and uses this signal as input for the OCCs. When the Test Mode (or Scan Mode) signal is asserted to "1", the OCCs propagate the free running clock pulses in the capture procedure, and propagate the ATE clock in load or unload procedures;

6) should clock gating logic be used, the Test Enable pin cannot be coupled to the Scan Enable used by OCCs. A different Scan Enable signal at the top-level hierarchy is instead used. This allows the ATPG tool to independently manage clock propagation through the OCCs and the logic circuits of the different domains of the design. During OCCs insertion, clock gating logic is enabled;

7) the OCC could be inserted at the RTL level too per above, and at the same time as the icOCC insertion. This flow has been successfully tried and gives similar results as those described below.

Figure 2:
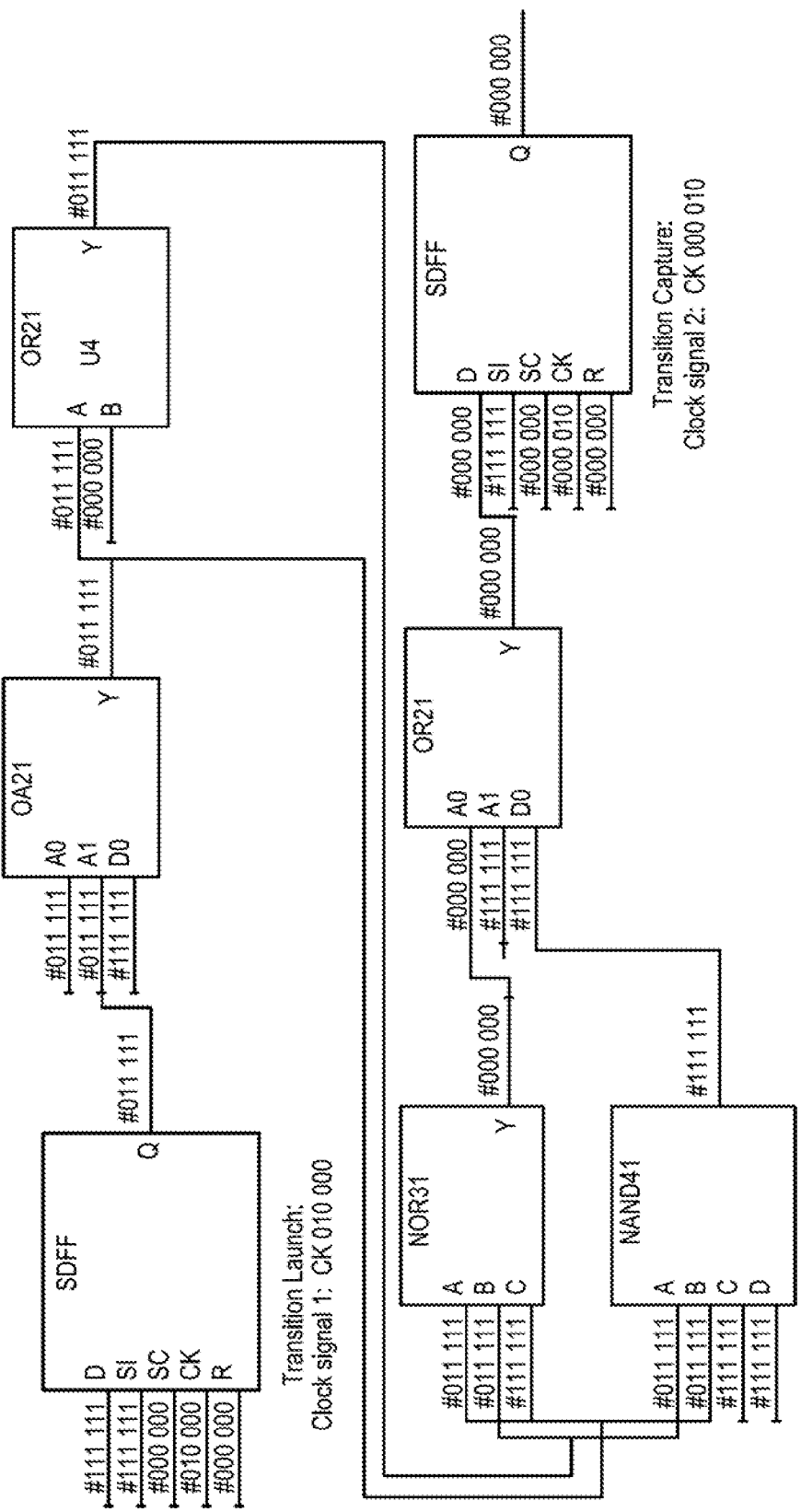
FIG. 2 is an exemplary cross-domain path as extracted from a commercial ATPG tool.

FIG. 2 is an exemplary cross domain path as extracted from a commercial ATPG tool: Tetramax Synopsys™.

According to an embodiment, a new additional functional-logic circuit block, termed "inter-domain on-chip-clock controller", briefly icOCC, interfaces with every suitably adapted OCC, for synchronizing the different OCCs that source the test clock signals coming from the external ATE according to the pattern generated by the ATPG tool and from internal at-speed test-clock generators to the respective scan chains of the different clock domains.

Figure 3:
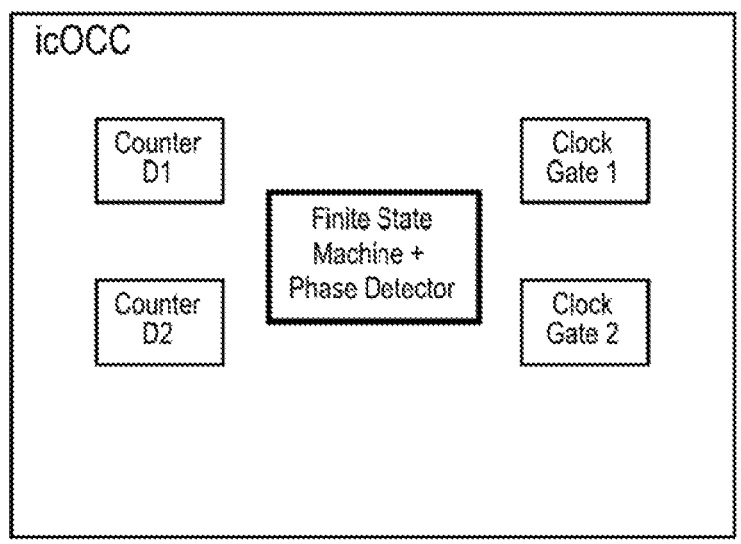
FIG. 3 shows fundamental blocks of an icOCC circuit according to an embodiment.

The fundamental blocks of an icOCC circuit according to an embodiment are depicted in FIG. 3.

The icOCC circuit block contains different functional blocks, basically an array of counters, one for each clock domain, pulsed by the respective internally generated clock signal (by a PLL or digital-divider circuit), and sourced by a dedicated OCC to test, at speed, the domain circuitry; a finite state machine, FSM, adapted to manage event generation in the scan-shift and in the scan-capture modes; and an array of clock gating cells, one for each clock domain sourced by the OCC.

By way of exemplary illustration, a verilog behavioral code description of the principal blocks intended for a full SCAN test technique are provided below.

The icOCC circuitry is inserted into the circuit design at the RTL level, while the OCCs may be inserted automatically by a script at the pre-scan net-list gate level following the rules identified in "Automatic Insertion Flow of On Chip Controller for At-Speed Testing", by Franco Cesari and Salvatore Talluto, presented at the SNUG Europe 2007 Conference and which is incorporated by reference; or they may be instantiated at RTL level and recognized by script, according to the technique disclosed in "Full Hierarchical Flow for Custom On-Chip Controller and Scan Compression Insertion for At-Speed Testing" by Franco Cesari, Paolo Giovacchini, Salvatore Talluto, and Alfredo Conte, presented at the SNUG Europe, 2008 Conference and which is incorporated by reference.

The icOCC needs to know each state of the controlled OCCs, and a script (for example in TCL language) may provide the required coupling of the signal state (clk_ctrl_data_#) of each OCC, in order to identify the pair of clock domains to be stimulated for launching and capturing the transition at-speed. The OCC Signal State is declared at RTL, for example as Verilog "wire", and coupled to ground before the scan-chain/OCC insertion. Only after the Scan Insertion step can the TCL script be loaded. It will allow coupling the signal state to the icOCC circuitry, building the appropriate BUS interface to each OCC.

By way of exemplary illustration, a generic top-level digital design with the requested signals is reported below as an embodiment adapted to perform the insertion of the at-speed scan structure for an embodiment employing three OCCs for each clock domain (the number OCCs that may be employed for each clock domain may be different and is not limited).

```
module TOP(
...;
reset_n, // reset scan signal active low
atg_scanenable, //ATPG Scan enable signal: 1,Scan Shift; 0 Scan
Capture
...,
...,
test_clk,// ATE external test clock
test_mode,// ATE Scan Mode active high
pll_bypass,// ATE at-speed scan test active low
...,
...,
CLOCK_1,// free running Xtal oscillator for
internal PLL
...,
...,
DFT_SHIFT_CLK // dedicated External Scan clock for clock chain
//to control the OCCs via ATE. It is possible to share it with the tst_clk
port //(for low pin application).
);
...
...
// these nets have to be declared and pre-coupled at RTL level
//because they are used by the Scripts for the icOCC-OCC interface.
wire [19:0]
clk_ctrl_data_0,clk_ctrl_data_1,clk_ctrl_data_2;
assign clk_ctrl_data_0 = 20'b00000000000000000001;
assign clk_ctrl_data_1 = 20'b00000000000000000001;
assign clk_ctrl_data_2 = 20'b00000000000000000001;
....
//PLL Clock Buffers according to the [SNUG paper]
tcell_clk_distr_bf_0 BUFF_OCC_0(.Z(CLK_PRE_0),
.A(CLK_PLL_0_int)); // fast clock
tcell_clk_distr_bf_1 BUFF_OCC_1(.Z(CLK_PRE_1),
.A(CLK_PLL_1_int)); // slow clock
tcell_clk_distr_bf_2 BUFF_OCC_2(.Z(CLK_PRE_2),
.A(CLK_PLL_2_int)); // slowest clock
...
//PLLs instantiation
clock_generator_CLK0 PLL0
(.ref(CLOCK_1),.clk(CLK_PLL_0));
clock_generator_CLK1 PLL1
(.ref(CLOCK_1),.clk(CLK_PLL_1));
clock_generator_CLK2 PLL2
(.ref(CLOCK_1),.clk(CLK_PLL_2));
Synthesis timing constraints for Design Compiler Synopsys ™
set_dont_touch [get_cells BUFF_OCC_0/BUF_LH]
set_dont_touch [get_cells BUFF_OCC_1/BUF_LH]
set_dont_touch [get_cells BUFF_OCC_2/BUF_LH]
create_clock -p 25 CLOCK_1
create_clock -p 1 [get_pins BUFF_OCC_0/A] -name
CLK_PLL_0
create_clock -p 2 [get_pins BUFF_OCC_1/A] -name
CLK_PLL_1
create_clock -p 4 [get_pins BUFF_OCC_2/A] -name
CLK_PLL_2
set_ideal_network [get_ports { RESET }] -
no_propagate
uniquify
compile -scan
```

Within the module TOP, the module icOCC, which contains the core of a novel architecture according to an embodiment, is instantiated.

```
CONTROLL_SOCC_SNPS icOCC_snps(
.CLK_0(CLK_PLL_0),
.CLK_1(CLK_PLL_1),
.CLK_2(CLK_PLL_2),
.CLR (atg_scanenable), //
.ATPG_SE(atg_scanenable),
.TEST_MODE(test_mode),
.CLK_O0(CLK_PLL_0_int),//icOCC provides the internal clock 1 to OCC1
.CLK_O1(CLK_PLL_1_int),// icOCC provides the internal clock 2 to OCC1
.CLK_O2(CLK_PLL_2_int),// icOCC provides the internal clock 3 to OCC1
.TSTCLK(test_clk),
.clk_ctrl_data_0(clk_ctrl_data_0),//State Signals for OCC1
.clk_ctrl_data_1(clk_ctrl_data_1),// State Signals for OCC2
.clk_ctrl_data_2(clk_ctrl_data_2)// State Signals for OCC3
```

The icOCC block manages both the Scan Shift and Scan Capture steps, in order to initialize each OCC in a known state during the scan shift pattern (ATPG_scan enable asserted at 1).

Scan Shift

Figure 4:
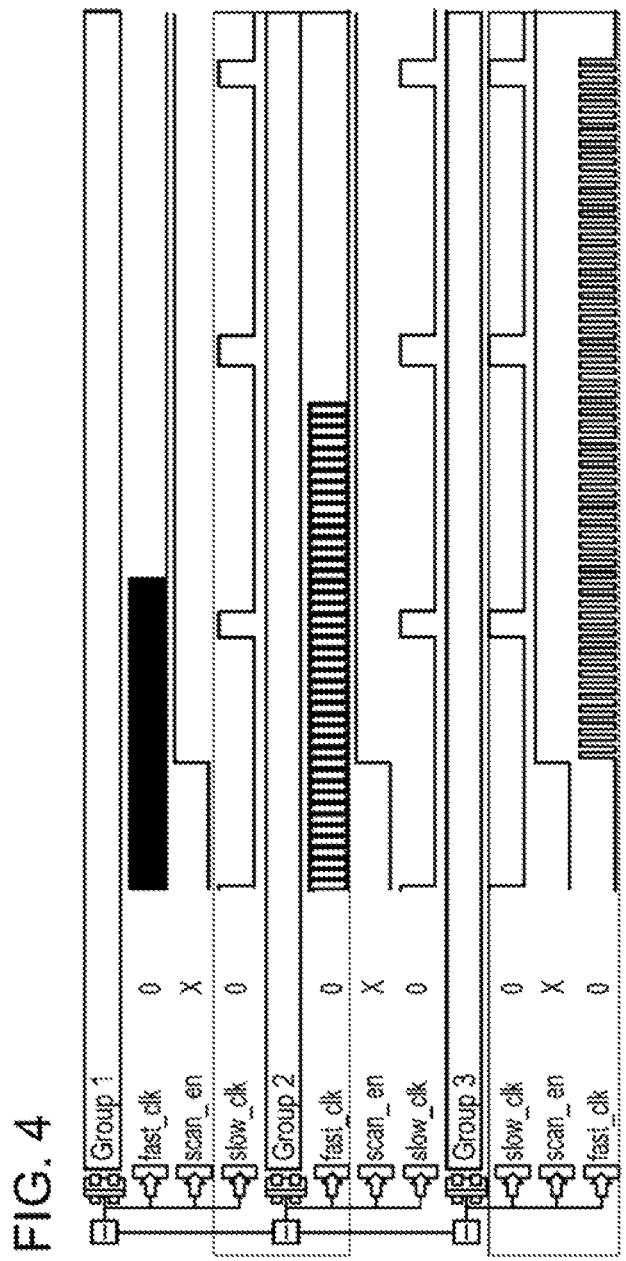
FIG. 4 shows the behavior of an icOCC circuit in a scan shift step (i.e., scan enable at 1), where each OCC was being initialized and the Pattern was loaded using the relatively slow external ATE clock, according to an embodiment, where the internal fastest clock signals are propagated in a predictable pulse range to initialize the OCCs (for example, 3 OCC are shown in FIG. 4 as being controlled by the icOCC).

With reference to FIG. 4, in an embodiment, the icOCC propagates the internal clock in order to initialize the finite state machines inside each OCC after the first external ATE clock pulse (slow clock in the timing diagrams of FIG. 4) when the ATPG scan enable in asserted at 1 (Scan Shift pattern)

After a respective number of pulses that is selected according to the application to initialize the finite state machine of each OCC, each counter of the icOCC generates an event (REF_X), which causes the icOCC to stop propagating the at-speed clock signals generated by the internal generators and to maintain its state before the next capture step.

```
counter COUNTER_C1 (
.C(CLK_0),
.CLR(ATPG_SE),
.Q(REF_1)
);
counter COUNTER_C2 (
.C(CLK_1),
.CLR(ATPG_SE),
.Q(REF_2)
);
counter COUNTER_C3 (
.C(CLK_2),
.CLR(ATPG_SE),
.Q(REF_3)
);
```

Each counter resets in capture step, ready for the next initialization for a successive shift step.

Scan Capture

A function of the icOCC according to an embodiment is to recognize the phase of clock signals of different frequencies that are instrumental to launch the at-speed transition in a cross-domain path and to capture the results.

Figure 5:
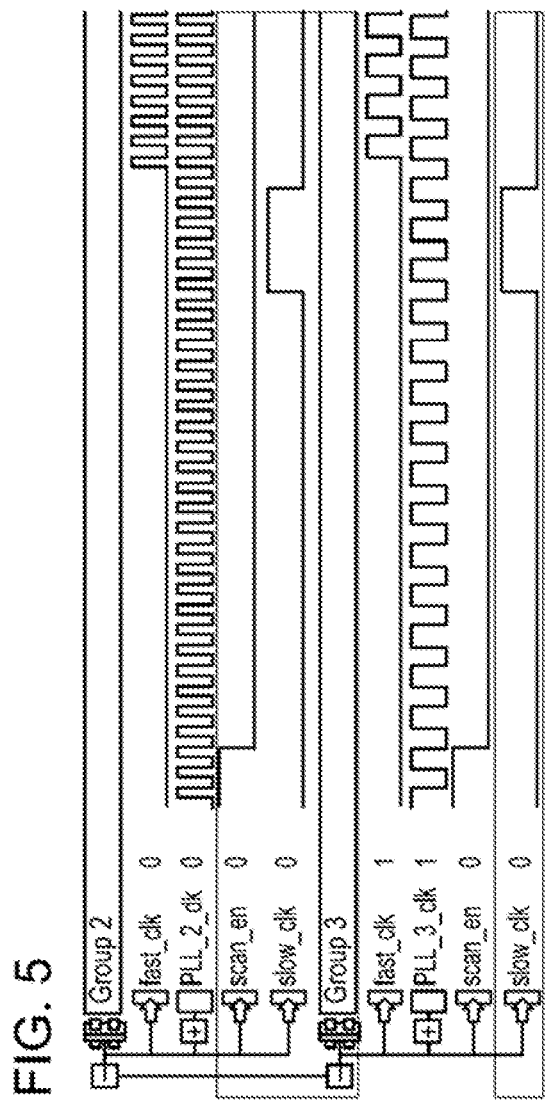
FIG. 5 shows the behavior of an icOCC circuit in a capture step (scan enable at 0), where the phase of the two at-speed clocks are recognized after the falling edge of the relatively slow external ATE clock, according to an embodiment.

With reference to FIG. 5, the PLL_X_int clocks at different frequencies are propagated after the falling edge of the external ATE (slow_clk) clock, by recognizing the related phases.

By way of example, a finite state machine code as the one reported below allows generating different predictable events when the synchronous clocks CLK1 and CLK2 move the machine among the states. One of the transition states may be chosen for generating a "Lock Event" that is used to open a clock gating cell within the icOCC module.

```
always @(posedge CLK_1 or posedge CLR)
  begin
  if (CLR)
    begin
        FF1_reg <= 1'd0;
    end
    else
    begin
        FF1_reg <= FF2_Nreg;
    end
  end
always @(posedge CLK_2 or posedge CLR)
  begin
   if (CLR)
    begin
        FF2_reg <= 1'b0;
        FF2_Nreg <= 1'b1;
    end
    else
    begin
        FF2_reg <= FF1_reg;
        FF2_Nreg <= ~(FF1_reg) ;
    end
  end
assign EVENT_OOint = FF1_reg & !FF2_reg;
```

Scan Capture—Alternative Possibility

The lock event of the previous synchronous finite state machine could be generated alternatively by the Asynchronous Phase Detector (APD), an embodiment of which is proposed down below for the icOCC-OCC interface.

```
module phase_async (
CLK_1,
CLK_2,
CLR,
EVENT_O
);
input CLK_1,CLK_2,CLR;
output EVENT_O;
wire F1,F2;
reg F1_reg,F2_reg;
always @(posedge CLK_1 or negedge F2_reg)
  begin
    if (!F2_reg)
      begin
        F1_reg <= 1'b0;
      end
      else
      begin
        F1_reg <= 1'b1;
      end
  end
always @(posedge CLK_2 or posedge F1_reg )
  begin
    if (F1_reg)
      begin
        F2_reg <= 1'b0;
      end
      else
      begin
        F2_reg <= 1'b1;
      end
  end
assign EVENT_O= F2_reg & !CLR
endmodule
```

This circuit maintains the flexibility of the previous embodiment: one domain is covered by each OCC and the icOCC recognizes the phases of different clock domains; but the APD allows overtaking some implementation requirement or constraints of previous Synchronous FSM for lock event generation.

One could avoid aligning the clock tree with zero clocks skew between the CLK_1 and CLK_2 and avoid the extra effort work to respect the setup or hold constraint of the FF1 or FF2 flops of the Synchronous FSM. The APD uses the asynchronous flops reset (CLR), which has a very short recovery removal time constraint compared to the SETUP/Hold time. This may make the circuit with APD embedded more robust than previous circuits.

There may be other advantages as well.

One, in order to avoid over buffering in Clock tree aligning or to avoid losing clock latency in cross domain (e.g., Launched by CLK_1 and captured by CLK_2), may design a circuit with clock latency constraint tolerating a deterministic skew between the clock CLK1 and CLK2. In this case one could identify the clock phase relation and modulate the logic transition between different clock domains using the clock chain within the OCC with a custom pattern.

The phase relation between different clocks may be recognized only after a determinate time after the initial of Capture Time (scan enable 0). The down below circuit is may guarantee the right time propagation of scan enable signal to all "Scan Flip Flops" within the circuit:

```
always @ (negedge TSTCLK) begin
  if (ATPG_SE) EEVENT = 1'b0; else EEVENT = 1'b1;
end
always @ (posedge EVENT_OOint) begin
  if (EEVENT) EEVENT_2 = 1'b1; else EEVENT_2 = 1'b0;
end
assign EEVENT_3 = EEVENT & EEVENT_2 & (!clk_ctrl_data_1);
// when the clock phase is detected after the TSTCLK, the pulses could
be enabled in case the domain 1 (clk_ctrl_data_1) have to be stimulated.
```

EVENT_3 is used by a combinatorial logic circuit that satisfies the following specification: "the clock-gating-cell (often named gator) enable signal must be activated when the Predictable Phase event has been detected after the falling edge of the external ATE clock (TSTCLK)"

The combinatorial circuit specified below manages the enabling of the clock gating cell in both steps, Scan Capture and Scan Shift. In Scan Shift, it allows propagating the fastest clock until OCC initialization, guaranteed by the events generated by each Counter (REF_X). In Scan Capture it allows propagating the fastest clock after the falling edge of the Scan enable ATPG_SE and after the first falling edge of the ATE clock.

```
always @ (EEVENT_3 or TEST_MODE or REF_3 or REF_2 or
  ATPG_SE)
begin
  if (~TEST_MODE) begin // for functional mode
      E_3_I <= 1'b1;
      E_2_I <= 1'b1;
    end
    else   // for Scan Mode
    begin
      if (ATPG_SE)
      begin // shift scan
         if (~REF_3 ) E_3_I <= 1'b1; else E_3_I <= 1'b0;
         if (~REF_2 ) E_2_I <= 1'b1; else E_2_I <= 1'b0;
      end
      else //capture scan
      begin
         E_3_I <= EEVENT_3;
         E_2_I <= EEVENT_3; // common launch from domain 2 to
domain 3
      end
    // endcase ;
      end
end
```

-continued

```
always @ (EVENT_3 or TEST_MODE or REF_1 or REF_3 or
ATPG_SE)
begin
   if (~TEST_MODE) begin // for functional mode
       E_1_I <= 1'b1;
       E_3_II <= 1'b1;
   end
   else // for Scan Mode
   begin
       if (ATPG_SE)
       begin // shift scan
           if (~REF_1 ) E_1_I <= 1'b1; else E_1_I <= 1'b0;
           if (~REF_3 ) E_3_II <= 1'b1; else E_3_II <= 1'b0;
       end
       else //capture scan
       begin
           E_1_I <= EVENT_3;
           E_3_II <= EVENT_3; // common launch from domain 1 to
domain 3
       end
   // endcase ;
       end
   end
```

State signals of the pertinent OCC are needed in order to control propagation of the at-speed clocks through the clock gating cell when the clk_ctrl_data_XX is loaded via the ATPG tool. This means that the XX domain will be stimulated following the rules coded below (three clock domains are contemplated in this example):

```
// only for inter clock and intra clock domain testing of D1 and D2
assign E_1 = E_1_I & (|clk_ctrl_data_0 || ATPG_SE );
assign E_2 = E_2_I & (|clk_ctrl_data_1 || ATPG_SE );
// common launch from domain 1 and 2 to domain 3
assign E_3 = (E_3_I || E_3_II) & (|clk_ctrl_data_2 || ATPG_SE);
```

The Enable E_x signal allows clock propagation during a shift scan step, when ATPG_SE is asserted at 1 and E_1I is at 1 for OCC initialization. In the capture scan step (ATPG_SE asserted at 0), the clock gating cell propagates the clock after detection of the EVENT_3 only if the OCCx is loaded (clk_ctrl_data_X) in order to stimulate the domain. An Oaring circuit guarantees this behavior:

```
   |clk_ctrl_data_1
   assign TE_3= !(|clk_ctrl_data_0) & !(|clk_ctrl_data_1) &
(|clk_ctrl_data_2) & !ATPG_SE;
```

In order to support particular cases, for example wherein a clock domain (for example D3) may capture transitions launched by other clock domains functioning at different frequencies (e.g. D1 and/or D2), a second pin of the clock gate cell (TE pin) may be used for enabling clock propagation. The TE and the E pins are generally ORed within the standard clock-gating cell.

The OCC signal state decoder has been used to enable clock propagation via the ATPG tool by the TE way: (!(|clk_ctrl_data_0) & !(|clk_ctrl_data_1) & (|clk_ctrl_data_2)).

| Clock gating Cell |
| --- |
| tcell_clk_distr_cbuf4occ I1 (.CP(CLK_0), .E(E_1), .TE(1'b0), .Q(CLK_O0));<br>tcell_clk_distr_cbuf4occ I2 (.CP(CLK_1), .E(E_2), .TE(1'b0), .Q(CLK_O1)); |

| Clock gating Cell |
| --- |
| tcell_clk_distr_cbuf4occ I3 (.CP(CLK_2), .E(E_3), .TE(TE_3), .Q(CLK_O2)); |

Figure 6:
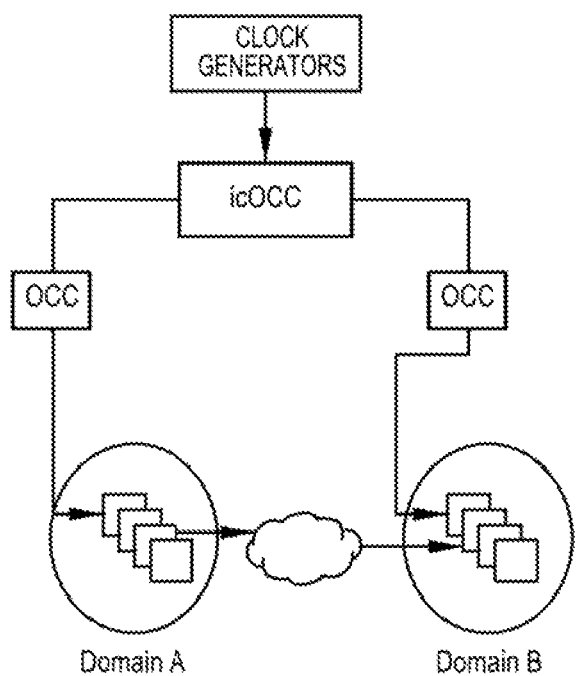
FIG. 6 is a basic scheme of an alternative embodiment that is supported by the ATPG tool used for verifying the effectiveness of a test architecture according to an embodiment.

FIG. 6 is the basic scheme of an alternative embodiment that is supported by the ATPG tool used for verifying the effectiveness of the novel architecture according to an embodiment.

The Tetramax Synopsys™ ATPG tool is capable of supporting the at-speed inter-clock pattern generation, to control the latency of the fastest clocks, generated by PLLs or Digital Dividers, but it may require the user to implement a circuit that synchronizes the clocks (both those generated by the internal PLL/digital dividers and the externally ATE generated clock) in a deterministic way, starting with a common event (e.g., the negative edge of the external ATE clock).

The designer's choice to use an embodiment of an icOCC synchronization circuit is manifested by the command of the ATPG SCRIPT and the SPF Instructions being: . . . ATPG script.

Command switches within the ATPG Tetramax Synopsys™ tool enable launching and capturing the clock pulses within the capture step window, between different clock domains. When the at-speed cross domain is activated, two domains per pattern are stimulated.

| SPF, STIL Protocol File for ATPG: |
| --- |
| set_delay -launch_cycle system_clock<br>set_delay -nocommon_launch_capture_clock -<br>allow_multiple_common_clocks -nopi_changes<br>set_drc -internal_clock_timing CTiming_X<br>....<br>.... |

It may also be possible to control the clock phase by managing the SPF variables: Latency and CTiming field.

```
PLLStructures "BUFF_OCC_2/pll_controller_CLK_2" {
    PLLCycles 20;
    Latency XX; // it is possible to add extra pulses XX latency to
// shift the launch & capture pulses
    Clocks {
        "test_clk" Reference;
        "BUFF_OCC_2/BUF_LH/Z" PLL {
            OffState 0;
        }
        "BUFF_OCC_2/pll_controller_CLK_2/U2/Z" Internal {
            OffState 0;
            PLLSource "BUFF_OCC_2/BUF_LH/Z";
            Cycle 0
    "BUFF_OCC_2/snps_clk_chain_2/U_shftreg_0/ff_19/q_reg/Q"
        1;
    ...
    ...
    ClockTiming CTiming_X {
        SynchronizedClocks group0 {
            Clock "BUFF_OCC_1/BUF_LH/Z" { Location
    "BUFF_OCC_1/pll_controller_CLK_1/U2/Z"; Period '2ns'; }
            Clock "BUFF_OCC_2/BUF_LH/Z" { Location
    "BUFF_OCC_2/pll_controller_CLK_2/U2/Z"; Period '4ns'; }
        }
}
```

Figure 7:
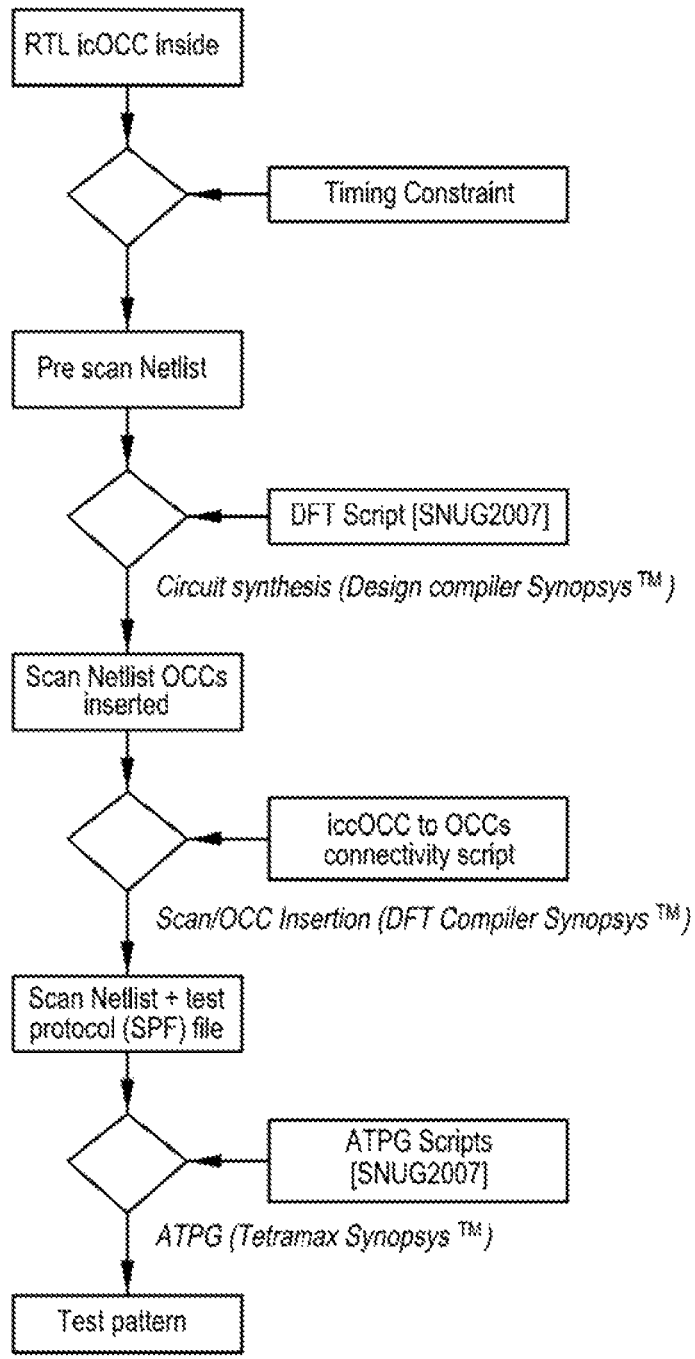
FIG. 7 illustrates an example of ATPG flow for cross-domain test-pattern generation, according to an embodiment.

FIG. 7 illustrates an example of ATPG flow for cross domain test pattern generation, according to an embodiment.

The cross-domain pattern stimulates the faults across the logic gates in FIG. 2 between two clock domains, pulsed by clock signal 1 and clock signal 2.

The comparison between the fault dictionaries written for inter-clock testing versus intra-clock confirms that the fault, which impacts a specific gate "U4" (by way of example refer to the timing analysis and fault dictionary herein below), belongs to the logic propagation path across two clock domains and is detected (Signals Clock time period per Domain 1: $CLK\_PLL\_{1\ at}$ 1 ns; Domain 2: $CLK\_PLL\_2$ at 2 ns).

1. Cross Domain Path (Timing analysis)

Startpoint:
INST_1/REG_OUT_regx0x
(rising edge-triggered flip-flop
clocked by CLK_PLL_1)
   Endpoint: INST_FSM/
   stato_regx0x
   (rising edge-triggered flip-flop
   clocked by CLK_PLL_2)
   Path Group: CLK_PLL_2
   Path Type: max

| Des/Clust/Port PROVA Small | | Library | |
| --- | --- | --- | --- |
| Point | Wire Load Model | Incr | Path |
| clock CLK_PLL_1 (rise edge) | | 1.00 | 1.00 |
| clock network delay (ideal) | | 0.00 | 1.00 |
| INST_1/REG_OUT_regx0x/CK | | 0.00 | 1.00 r |
| INST_1/REG_OUT_regx0x/Q | | 0.16 | 1.16 r |
| INST_1/U44/Y | | 0.09 | 1.25 r |
| INST_1/OUT[0](flops_shift_2) | | 0.00 | 1.25 r |
| U4/A<- | | | 1.25r |
| U4/Y | | 0.06 | 1.31 r |
| INST_FSM/ingressi[2](FSM) | | 0.00 | 1.31 r |
| INST_FSM/U6/Y | | 0.08 | 1.39 r |
| INST_FSM/U5/Y | | 0.04 | 1.43 f |
| INST_FSM/stato_regx0x/D | | 0.00 | 1.43 f |
| data arrival time | | | 1.43 |
| clock CLK_PLL_2 (rise edge) | | 2.00 | 2.00 |
| clock network delay (ideal) | | 0.00 | 2.00 |
| INST_FSM/stato_regx0x/CK | | 0.00 | 2.00 r |
| library setup time | | −0.06 | 1.94 |
| data required time | | | 1.94 |
| data required time | | | 1.94 |
| data arrival time | | | −1.43 |
| slack (MET) | | | 0.50 |

2. Fault Dictionaries

| | |
| --- | --- |
| ./provaTF.dict:str AN U4/A | |
| ./provaTFcross.dict:str DS U4/A | |

The fault dictionaries of the classic Pattern, generated for intra-clock domain testing, confirm that the fault is not testable (AN) by the ATPG tool, but is caught by the second Pattern generated for inter-clock domain testing. The second fault dictionary contains the information on the detected fault (DS—Detected).

Figure 8:
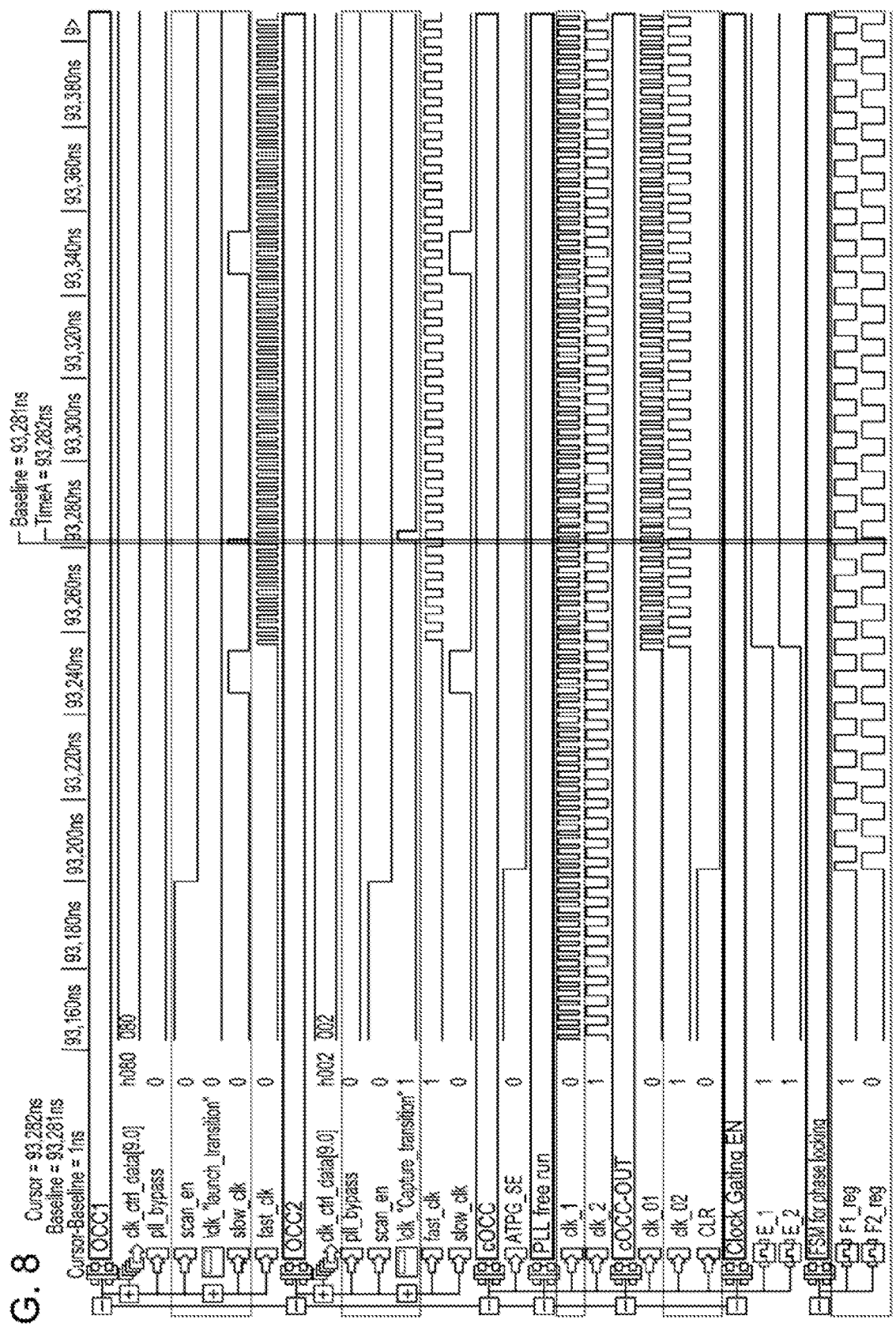
FIG. 8 includes timing diagrams showing simulation results of cross domain at-speed testing of a multi-clock domain digital IC according to an embodiment.

In FIG. 8 is shown timing diagrams of simulation results of cross domain at-speed testing of a multi-clock-domain digital IC.

The final waveforms demonstrate how the icOCC works as expected showing how the FSM within the icOCC evolves through the state (F1_reg, F2_reg).

When the lock phase between the fastest and slowest internal PLL-generated clocks (CLK_1 and CLK_2) is detected after the falling edge of the external ATE clock (slow clock), the clock-gating cell can propagate the at-speed clock signals (CLK_01 and CLK_02) to the respective two pertinent OCCs.

The pulse time, which stimulates the gate logic, launching the transition "clk-launching" and result-capturing "clk-Capture", depends on the user who may modify the clock latency by ATPG script and SPF instruction.

An embodiment adopts a deterministic synchronization mechanism between slow ATE clocks and fast internally generated test clock signals "at speed", whilst the rest of the scan structure is inserted automatically. This makes for an outstanding flexibility of an embodiment of the at-speed test architecture.

It is so made possible to introduce general purpose circuitry adapted to change the at-speed test frequency so that the IC may eventually be requalified. By contrast, with the custom approach of conventional BIST architectures, wherein a certain clock ratio range between different clock domains at RTL level must be respected, the possibility of chip requalification may be very limited.

According to an embodiment, changing of the clock ratio has no impact on the RTL level. Therefore, it may be possible to set the OCC clock chain depth in order to calibrate pulse propagation by TCL script. By contrast, with a custom approach of conventional inter-domain at-speed testing, the clock chain depth is fixed at the RTL level.

The OCCs are normally nested in the design hierarchy, and can be reused for inter-clock domain at-speed testing if the icOCC is instantiated at the RTL level. Only the clock-domain-matrix information is needed (who-speaks-with-whom?) in order to adapt the icOCC circuitry.

Many custom solutions use the d_se (delayed scan enable) signal to lock the counter in respect to only the fastest PLL clock; by contrast, an embodiment overcomes the OCCs' metastability problem for every clock domain. Therefore, there is no need to implement metastability registers at the RTL level for re-sampling the scan enable.

Other recent industrial solutions propose to recognize the frequency relation between different clocks (0p5x, 1x, 2x, 4x . . . ), counting the edge transition of the fastest versus the slower clock signal frequencies, and sampling the common scan enable signal with the fastest clock before providing it to slower clock domain. This technique may impose more restrictive constraints about the phase relation between different clock signals that cannot be skewed.

Moreover, adopting the APD solution, it may be possible to test the transition fault which impacts in the logic path, with different clock phases.

Overall, the digital RTL designer doesn't need to know further test signal specifications to implement an embodiment of the icOCC circuits.

Furthermore, an integrated circuit on which one or more icOCCs may be included may be any type of integrated circuit, for example, a controller such as a processor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A test apparatus for at-speed testing a multi-clock-domain digital integrated circuit including at least a scan chain and combinational logic in each clock domain, configured to use external automatic test equipment and an automatic test pattern generator tool of automatic-test-pattern generation in an inter-domain mode for detecting time-related faults, the apparatus comprising:

internal clock generators of different clocks at the frequency of operation of the different clock domains;

a dedicated clock sourcing logic circuit for each clock domain, each clock sourcing logic circuit configured to deliver test clock pulses originating from the external automatic test equipment according to the pattern generated by the automatic test pattern generator tool, and from internal clock generators, to the scan chains of the respective clock domain;

a controller circuit interfaced with each clock sourcing logic circuit and configured to synchronize the different clock sourcing logic circuits with said test clock pulses from said external automatic test equipment.

2. The test apparatus of claim 1, wherein the number of clock sourcing logic circuits for a clock domain is equal to the number of internally generated clock signals for the clock domain.

3. The test apparatus of claim 1, wherein said controller circuit includes a plurality of counters of pulses of respective internally generated clock signals for at-speed inter-domain testing, a finite state machine input with the output value of said counters, a plurality of clock gating circuits, each coupled to an input of one of said clock sourcing logic circuits of respective clock domains of the digital integrated circuit.

4. The test apparatus of claim 1, wherein signals corresponding to said controller circuit are at a register transfer level, and signals corresponding to the clock sourcing logic circuits are inserted automatically either by a script at pre-scan or a net-list at gate level.

5. The test apparatus of claim 1, wherein signals corresponding to said control circuit are at a register transfer level, and signals corresponding to the clock sourcing logic circuits are inserted at the register transfer level while said control circuit is being inserted.

6. The test apparatus of claim 1, wherein the multi-clock-domain digital integrated circuit comprises a single integrated circuit die.

7. The test apparatus of claim 1, wherein the multi-clock-domain digital integrated circuit comprises multiple integrated circuit dies.

8. The test apparatus of claim 1, wherein the controller circuit comprises a single integrated circuit die.

9. The test apparatus of claim 1, wherein the controller circuit comprises multiple integrated circuit dies.

10. The test apparatus of claim 1, wherein the controller circuit comprises a processor.

11. The test apparatus of claim 1, wherein the controller circuit comprises a memory.

12. An apparatus, comprising:

an integrated circuit having a plurality of clock domains, each clock domain associated with a respective scan chain;

a plurality of internal clock generators, each internal clock generator configured to generate different clock signals at a frequency of a clock domain;

a plurality of clock sourcing logic circuits adapted to generate test clock pulses according to a pattern to the scan chains of each clock domain; and a controller circuit interfaced with each clock sourcing logic circuit and configured to synchronize each clock sourcing logic circuit with the generated test clock pulses.

13. The apparatus of claim 12, wherein the plurality of clock sourcing logic circuits comprises a number of clock sourcing logic circuits that is equal to a number of internally generated clock signals for a respective clock domain.

14. The apparatus of claim 12, wherein the controller circuit further comprises:

a plurality of counters configured to count pulses of a respective internally generated clock signal for at-speed inter-domain testing;

a finite state machine input coupled to the plurality of counters; and a plurality of clock gating circuits, each respectively coupled to an input of one of the clock sourcing logic circuits of a respective clock domain.

15. The apparatus of claim 12 wherein the controller circuit further comprises first and second integrated circuits disposed on a same die.

16. The apparatus of claim 12 wherein the controller circuit further comprises first and second integrated circuits disposed on different dies.

17. The apparatus of claim 12 wherein the controller circuit further comprises a processor.

18. The apparatus of claim 12 wherein the controller circuit further comprises a memory.

\* \* \* \* \*